United States Patent
Luo et al.

(10) Patent No.: US 12,431,718 B2
(45) Date of Patent: Sep. 30, 2025

(54) DATA CABLE AND CHARGING DEVICE

(71) Applicant: VIVO MOBILE COMMUNICATION CO., LTD., Guangdong (CN)

(72) Inventors: Fangding Luo, Guangdong (CN); Yanbin Liu, Guangdong (CN)

(73) Assignee: VIVO MOBILE COMMUNICATION CO., LTD., Guangdong (CN)

( * ) Notice: Subject to any disclaimer, the term of this patent is extended or adjusted under 35 U.S.C. 154(b) by 409 days.

(21) Appl. No.: 18/070,900

(22) Filed: Nov. 29, 2022

(65) Prior Publication Data
US 2023/0096538 A1 Mar. 30, 2023

Related U.S. Application Data

(63) Continuation of application No. PCT/CN2021/096261, filed on May 27, 2021.

(30) Foreign Application Priority Data

May 29, 2020 (CN) .......................... 202010478104.9

(51) Int. Cl.
*H02J 7/00* (2006.01)
*H01R 13/70* (2006.01)
*H10D 89/60* (2025.01)

(52) U.S. Cl.
CPC .......... *H02J 7/00034* (2020.01); *H01R 13/70* (2013.01); *H10D 89/713* (2025.01)

(58) Field of Classification Search
CPC .................................................. H10D 89/713

(Continued)

(56) References Cited

U.S. PATENT DOCUMENTS 6,175,518 B1  1/2001  Scott et al.
8,622,756 B2  1/2014  Smed
(Continued)

FOREIGN PATENT DOCUMENTS

CN   103064489 A   4/2013
CN   103208831 A   7/2013
(Continued)

OTHER PUBLICATIONS

First Office Action for Chinese Application No. 202010478104.9, dated Apr. 23, 2021, 9 Pages.
(Continued)

*Primary Examiner* — Lihong Yu
(74) *Attorney, Agent, or Firm* — BROOKS KUSHMAN P.C.

(57) ABSTRACT

A data cable and a charging device. The data cable includes a Type-A interface, a first interface, and a cable, where a VBUS pin, a D+ pin, a D− pin, and a GND pin in each of the Type-A interface and the first interface are connected in a one-to-one correspondence; and the data cable is provided with a circuit identification module, where the circuit identification module includes a pull-up resistor, a switch circuit, and a filter circuit, a first terminal of the switch circuit is connected to a CC pin of the first interface, a second terminal is connected to a first terminal of the pull-up resistor, a third terminal is connected to a CC pin of the Type-A interface, where under the control of the filter circuit, the first terminal of the switch circuit is connected to the second terminal or the third terminal.

16 Claims, 2 Drawing Sheets

(58) Field of Classification Search
USPC .......................................................... 375/257
See application file for complete search history.

(56) References Cited

U.S. PATENT DOCUMENTS

| | | | | |
|---|---|---|---|---|
| 2007/0081679 | A1* | 4/2007 | Suzuki | .................. H04R 15/00 |
| | | | | 381/152 |
| 2013/0103966 | A1 | 4/2013 | Liu | |
| 2015/0346790 | A1* | 12/2015 | Talmola | .............. G06F 13/4068 |
| | | | | 713/300 |
| 2018/0152183 | A1* | 5/2018 | Vemula | ............... G06F 13/4282 |

FOREIGN PATENT DOCUMENTS

| | | |
|---|---|---|
| CN | 103678227 A | 3/2014 |
| CN | 108206444 A | 6/2018 |
| CN | 108233130 A | 6/2018 |
| CN | 207517932 U | 6/2018 |
| CN | 208861270 U | 5/2019 |
| CN | 110534988 A | 12/2019 |
| CN | 110716891 A | 1/2020 |
| CN | 210129644 U | 3/2020 |
| CN | 111509814 A | 8/2020 |

OTHER PUBLICATIONS

International Search Report and Written Opinion for Application No. PCT /CN2021/096261, dated Aug. 16, 2021, 8 Pages.
Extended European Search Report for Application No. 218162624.1, dated Jul. 25, 2024, 9 Pages.
Extended European Search Report for Application No. 21812624.1, dated Jul. 25, 2024, 9 Pages.

* cited by examiner

DATA CABLE AND CHARGING DEVICE

CROSS-REFERENCE TO RELATED APPLICATIONS

This application is a continuation of International Application No. PCT/CN2021/096261 filed on May 27, 2021, which claims priority to Chinese Patent Application No. 202010478104.9 filed on May 29, 2020, which are hereby incorporated by reference in their entireties.

TECHNICAL FIELD

This application relates to the field of communication technologies, and specifically, to a data cable and a charging device.

BACKGROUND

With the development of science and technology, fast charging is more widely applied.

In the related art, a power delivery (Power Delivery, PD) protocol is usually used for fast charging. Chargers supporting PD protocol charging need to perform communication by using a CC signal line, and the chargers supporting PD protocol charging often use a third standard (Type-C) interface in combination with a Type-C to Type-C data cable. A data cable using a first standard (Type-A or Standard-A) interface performs communication by using a D+/D− signal line and cannot support PD protocol charging. However, the data cable with the Type-A interface is currently the most widely used data cable. As a result, Type-A interfaces on conventional data cables do not support PD protocol charging.

SUMMARY

The purpose of the embodiments of this application is to provide a data cable and a charging device, which can resolve a problem that a data cable with a Type-A interface does not support PD protocol charging.

To resolve the foregoing technical problem, this application is implemented as follows:

According to a first aspect, the embodiments of this application provide a data cable, where the data cable includes a Type-A interface and a first interface, where the Type-A interface and the first interface are connected by a cable, each of the Type-A interface and the first interface includes a VBUS pin, a CC pin, a D+ pin, a D− pin, and a GND pin, and the VBUS pins, the D+ pin, the D− pin, and the GND pin in each of the Type-A interface and the first interface are connected in a one-to-one correspondence; and the data cable is provided with a circuit identification module, the circuit identification module includes a pull-up resistor, a switch circuit, and a filter circuit, where a first terminal of the switch circuit is connected to the CC pin of the first interface, a second terminal of the switch circuit is connected to a first terminal of the pull-up resistor, a third terminal of the switch circuit is connected to the CC pin of the Type-A interface, a second terminal of the pull-up resistor is connected to the VBUS pin of the first interface, a first terminal of the filter circuit is connected to the CC pin of the Type-A interface, a second terminal of the filter circuit is connected to the GND pin of the first interface, and an output terminal of the filter circuit is connected to a control terminal of the switch circuit, where under the control of the filter circuit, the first terminal of the switch circuit is connected to the second terminal or the third terminal of the switch circuit.

According to a second aspect, the embodiments of this application provide a charging device, where the charging device includes a data cable and a charger, the data cable is the data cable according to the first aspect, the charger includes a Type-A female socket matching the Type-A interface of the data cable, and the Type-A female socket includes: a VBUS pin, a CC pin, a D+ pin, a D− pin, and a GND pin.

In the embodiments of this application, the CC pin is arranged in the Type-A interface of the data cable, and a CC communication signal transmitted on the CC pin of the Type-A interface is filtered into a stable control signal by using the filter circuit, and a switch status of the switch circuit is controlled according to the control signal. Therefore, when the first terminal and the second terminal of the switch circuit are connected, the CC pin of the Type-A interface is disconnected from the CC pin of the first interface, so that the data cable can perform only non-PD protocol communication through the D+ pin and the D− pin. When the first terminal and the third terminal of the switch circuit are connected, the CC pin of the Type-A interface is connected to the CC pin of the first interface, so that the data cable can support non-PD protocol communication through the D+ pin and the D− pin and support PD protocol communication through the CC pin, and the data cable with the Type-A interface can support PD protocol charging.

DETAILED DESCRIPTION

The following clearly describes the technical solutions in the embodiments of this application with reference to the accompanying drawings in the embodiments of this application. Apparently, the described embodiments are some of the embodiments of this application rather than all of the embodiments. All other embodiments obtained by a person of ordinary skill in the art based on the embodiments of this application shall fall within the protection scope of this application.

The specification and claims of this application, and terms "first" and "second" are used to distinguish similar objects, but are unnecessarily used to describe a specific sequence or order. It should be understood that the data termed in such a way are interchangeable in appropriate circumstances, so that the embodiments of this application described herein can be implemented in orders other than the order illustrated or described herein. In addition, "and/or" in this specification and the claims represents at least one of the connected objects, the character "/" generally represents an "or" relationship between the associated objects.

A data cable and charging device provided in the embodiments of this application are described in detail below with reference to the accompanying drawings by using specific embodiments.

Figure 1:
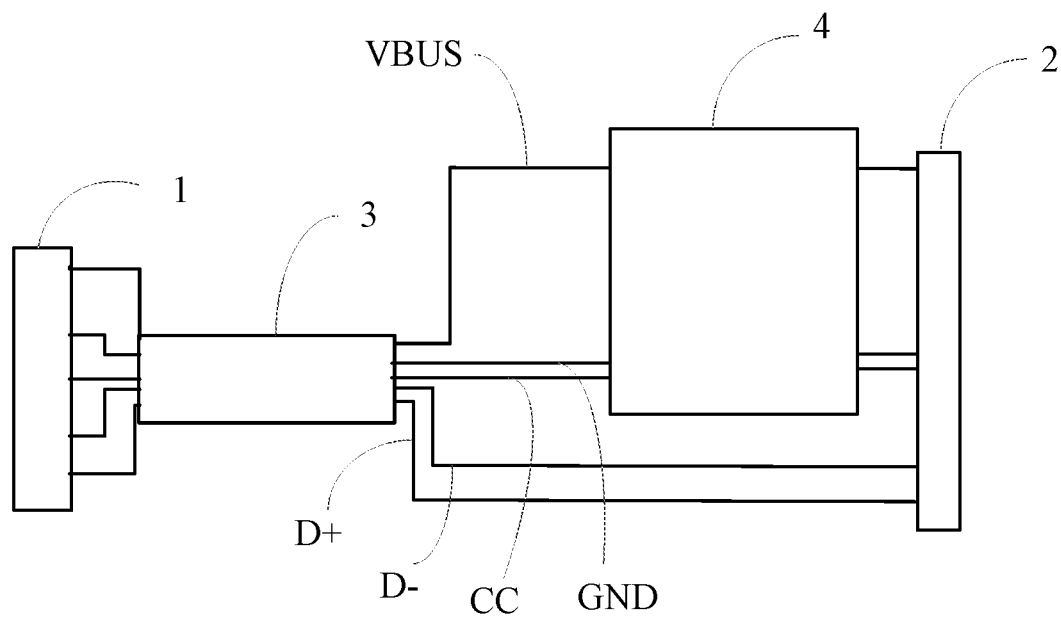
FIG. 1 a structure of a data cable according to an embodiment of this application.
Figure 2:
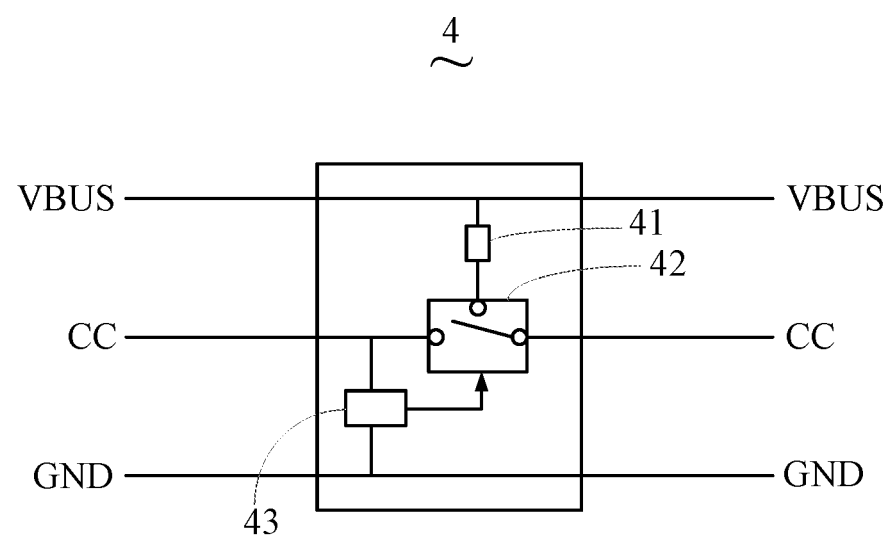
FIG. 2 is a structural diagram of an identification module in a data cable according to an embodiment of this application.

Referring to FIG. 1 and FIG. 2, FIG. 1 is a structure of a data cable according to an embodiment of this application; and FIG. 2 is a structural diagram of an identification module in a data cable according to an embodiment of this application.

The data cable includes: a Type-A interface 1 and a first interface 2, the Type-A interface 1 and the first interface 2 are connected by a cable 3, each of the Type-A interface 1 and the first interface 2 includes a VBUS pin, a CC pin, a D+ pin, a D− pin, and a GND pin, and the VBUS pin, the D+ pin, the D− pin, and the GND pin in each of the Type-A interface 1 and the first interface 2 are connected in a one-to-one correspondence.

The data cable is provided with a circuit identification module 4, where the circuit identification module 4 includes a pull-up resistor 41, a switch circuit 42, and a filter circuit 43, where a first terminal of the switch circuit 42 is connected to the CC pin of the first interface 2, a second terminal of the switch circuit 42 is connected to a first terminal of the pull-up resistor 41, a third terminal of the switch circuit 42 is connected to the CC pin of the Type-A interface 1, a second terminal of the pull-up resistor 41 is connected to the VBUS pin of the first interface 2, a first terminal of the filter circuit 43 is connected to the CC pin of the Type-A interface 1, a second terminal of the filter circuit 43 is connected to the GND pin of the first interface 2, and an output terminal of the filter circuit 43 is connected to a control terminal of the switch circuit 42.

Under the control of the filter circuit 43, the first terminal of the switch circuit 42 is connected to the second terminal or the third terminal of the switch circuit 42.

In the prior art, mobile terminals such as mobile phones often support fast charging of DP and DM communication protocols, and the data minus (Data Minus, DM) signal charging communication protocol and the data positive (Data Positive, DP) signal charging communication protocol transmit communication signal by using a D+ pin and a D− pin, while electronic devices such as notebooks support fast charging of the PD communication protocol, and the PD communication protocol transmits a communication signal by using a CC pin. In the prior art, data cables that support the PD communication protocol are all data cables in the form of Type-C to Type-C, and data cables that support the DP/DM communication protocols are all data cables in the form of Type-A to Type-C, so that the data cables supporting the PD communication protocol and the data cables supporting the DP/DM communication protocol cannot be used universally.

In this implementation, the data cable is a data cable including the Type-A interface 1, and a CC pin is added to the Type-A interface 1, and when a signal of a CC communication protocol is transmitted on the CC pin, the CC pin of the Type-A interface 1 is connected to the CC pin of the first interface 2, so that PD fast charging can be performed on a device to be charged. In addition, in this implementation, the first interface 2 may be a Type-C interface, to connect the data cable and a device to be charged having a Type-C socket.

Certainly, with the development of science and technology, the first interface 2 may further be an existing interface or another interface that may appear in the future, which is not specifically limited herein.

In addition, in actual application, in a case that the device to be charged supports only non-PD fast charging of the DP and DM communication protocols, DP and DM communication channels on the data cable are still in an on state, so that fast charging of the DP and DM protocols can be performed on the device to be charged.

It should be noted that, in a case that the first terminal of the switch circuit 42 is connected to the second terminal of the switch circuit 42, the first terminal of the switch circuit 42 is disconnected from the third terminal of the switch circuit 42; and in a case that the first terminal of the switch circuit 42 is connected to the third terminal of the switch circuit 42, the first terminal of the switch circuit 42 is disconnected from the second terminal of the switch circuit 42.

In addition, during operation, the first terminal of the switch circuit 42 may be connected to the third terminal of the switch circuit 42 by default, so that the data cable performs CC communication with a device to be charged, and within a preset time of the CC communication, in a case that the CC pin of the Type-A interface obtains a CC communication signal, the first terminal of the switch circuit 42 is switched to be connected to the second terminal of the switch circuit 42. The preset time may be 3 seconds, 5 seconds, or the like, which is not specifically limited herein.

In addition, a connection relationship between the VBUS pins, the D+ pins, the D+ pins, the D− pins, and the GND pins in the Type-A interface 1 and the first interface 2 and wires in the cable 3 is the same as a connection relationship between pins and wires in the prior art. For example, in a case that the first interface 2 is a Type-C interface, the connection relationship between pins in the Type-C interface and the Type-A interface 1 and the wires in the cable 3 is specifically a connection relationship shown in Table 1.

TABLE 1

| Type-C interface | Cable | Type-A interface |
|---|---|---|
| GND pin | GND wire | GND pin |
| VBUS pin | VBUS wire | VBUS pin |
| CC1 pin | CC1 wire | CC pin |
| CC2 pin | | |
| D+ pin | D+ wire | D+ pin |
| D− pin | D− wire | D− pin |

In this implementation, in a case that the CC pin of the Type-A interface 1 receives a CC communication signal, the CC communication signal is adjusted into a stable control signal through the filter circuit 43 to control the switch circuit 42 according to the control signal. During specific implementation, the control signal may be a high-level signal, so that the switch circuit 42 may connect the first terminal and the third terminal of the switch circuit in a case of receiving the high-level signal; and the switch circuit 42 may connect the first terminal and the second terminal of the switch circuit in a case of receiving a low-level signal less than the high-level signal.

Certainly, during specific implementation, the filter circuit 43 may further adjust the CC communication signal received by the CC pin of the Type-A interface 1 into another control signal.

In this implementation, the CC pin is arranged in the Type-A interface, a communication signal transmitted on the CC pin of the Type-A interface is converted into a control signal by using the filter circuit, to control connection or disconnection between the CC pin and the CC pin of the first interface, so that in a case that there is a signal on the CC pin of the Type-A interface, the CC pin can be controlled to be connected to the CC pin of the first interface. Therefore, a PD communication channel in the data cable is connected, to support PD fast charging. In a case that there is no signal on the CC pin of the first Type-A interface, the CC pin is controlled to be disconnected from the CC pin of the first interface, so that the PD communication channel in the data cable is disconnected. In this case, the PD fasting charging is not supported. In this way, in a case that the device to be charged connected to the data cable supports PD fast charging, the PD communication channel in the data cable can be connected, and PD fast charging can be performed on the device to be charged. In a case that the device to be charged connected to the data cable does not support the PD fast charging, the PD communication channel in the data cable is disconnected, and the DP communication channel and the DM communication channel are always connected, so that fast charging of the DP/DM communication protocol is performed on the device to be charged.

In an optional implementation, the circuit identification module 4 is arranged in the cable 3, and a distance between the circuit identification module 4 and one end of the first interface 2 is less than a distance between the circuit identification module and one end of the Type-A interface 1.

In this implementation, the identification module 4 is arranged in the cable 3, to switch a corresponding connection relationship between the CC pin of the Type-A interface 1 and the CC pin of the first interface 2 is switched in the cable 3.

In addition, the distance between the circuit identification module 4 and one end of the first interface 2 is less than the distance between the circuit identification module and one end of the Type-A interface 1, and the identification module 4 may be arranged close to the first interface 2, so that a problem that arranging a circuit board structure including the identification module 4 in the middle of the cable 3 affects the smoothness and aesthetics of the cable 3 can be avoided. Certainly, during specific implementation, the distance between the circuit identification module 4 and one end of the first interface 2 is less than the distance between the circuit identification module and one end of the Type-A interface 1, and the identification module 4 may alternatively be arranged close to the Type-A interface 1, so that a problem that arranging a circuit module with a relatively large diameter in the middle of the cable 3 affects the smoothness and aesthetics of the cable 3 can also be avoided.

In addition, during specific implementation, in a case that the circuit identification module 4 is arranged in the cable 3, the third terminal of the switch circuit 42 is connected to a CC wire in the cable 3 connected to the CC pin of the Type-A interface 1, the second terminal of the pull-up resistor 41 is connected to a VBUS wire in the cable 3, the first terminal of the filter circuit 43 is connected to the CC wire in the cable 3 connected to the CC pin of the Type-A interface 1, and the second terminal of the filter circuit 43 is connected to a GND wire in the cable 3. Two ends of the VBUS wire are respectively connected to the VBUS pin of the Type-A interface 1 and the VBUS pin of the first interface 2, and two ends of the GND wire are respectively connected to the GND pin of the Type-A interface 1 and the GND pin of the first interface 2.

Figure 3:
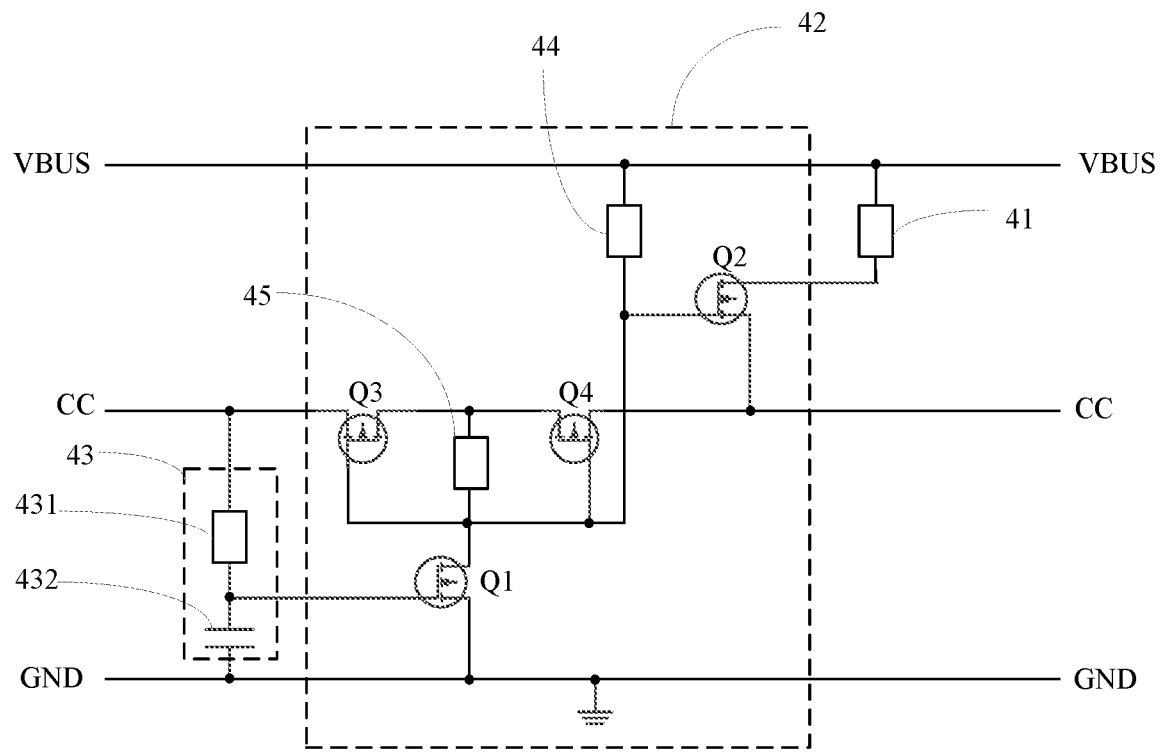
FIG. 3 is a circuit diagram of an identification module in a data cable according to an embodiment of this application.

In an optional implementation, as shown in FIG. 3, the switch circuit 42 includes a first switch transistor Q1, a second switch transistor Q2, a third switch transistor Q3, a fourth switch transistor Q4, a first resistor 44, and a second resistor 45.

A first electrode of the first switch transistor Q1 is the control terminal of the switch circuit 42, a second electrode of the first switch transistor Q1 is connected to a first electrode of the second switch transistor Q2, a first electrode of the third switch transistor Q3, and a first electrode of the fourth switch transistor Q4, and a third electrode of the first switch transistor Q1 is connected to the GND pin of the first interface 2.

The first electrode of the second switch transistor Q2 is further connected to the VBUS pin of the first interface 2 through the first resistor 44, a second electrode of the second switch transistor Q2 is the second terminal of the switch circuit 42, and a third electrode of the second switch transistor Q2 is the first terminal of the switch circuit 42.

A second electrode of the third switch transistor Q3 is the third terminal of the switch circuit 42, and a third electrode of the third switch transistor Q3 is connected to the second electrode of the first switch transistor Q1 through the second resistor 45.

A second electrode of the fourth switch transistor Q4 is connected to the third electrode of the second switch transistor Q2, and a third electrode of the fourth switch transistor Q4 is connected to the third electrode of the third switch transistor Q3.

In a case that there is no signal on the CC pin of the Type-A interface 1, the first switch transistor Q1, the third switch transistor Q3, and the fourth switch transistor Q4 are all in an off state, and the second switch transistor Q2 is in an on state; and in a case that there is a signal on the CC pin of the Type-A interface 1, the first switch transistor Q1, the third switch transistor Q3, and the fourth switch transistor Q4 are all in the on state, and the second switch transistor Q2 is in the off state.

During specific implementation, in a case that a signal is transmitted on the CC pin of the Type-A interface 1, the filter circuit 43 adjusts the signal on the CC pin of the Type-A interface 1 into a high-level signal, so that when the first electrode of the first switch transistor Q1 receives the high-level signal, the first switch transistor Q1 is controlled to be on, that is, the second electrode and the third electrode of the first switch transistor Q1 are connected. In this case, the first electrode of the second switch transistor Q2, the first electrode of the third switch transistor Q3, and the first electrode of the fourth switch transistor Q4 are connected to the GND pin through the first switch transistor Q1, so that the third switch transistor Q3 and the fourth switch transistor Q4 are turned on, that is, the second electrode and the third electrode of the third switch transistor Q3 are connected, and the second electrode and the third electrode of the fourth switch transistor Q4 are connected, and the second switch transistor Q2 is turned off, that is, the second electrode and the third electrode of the second switch transistor Q2 are disconnected.

In an implementation, the first switch transistor Q1 and the second switch transistor Q2 are N-type transistors, and the third switch transistor Q3 and the fourth switch transistor Q4 are P-type transistors. Specifically, the first switch transistor Q1 and the second switch transistor Q2 are N-metal-oxide semiconductor (N-Metal-Oxide Semiconductor, NMOS) transistors, and the third switch transistor Q3 and the fourth switch transistor Q4 are P-metal-oxide semiconductor (P-Metal-Oxide Semiconductor, PMOS) transistors.

During application, the first electrode of the first switch transistor Q1 may be a grid electrode, the second electrode of the first switch transistor may be a drain electrode, and the third electrode of the first switch transistor may be a source electrode. The first electrode of the second switch transistor Q2 may be a grid electrode, the second electrode of the second switch transistor may be a drain electrode, and the third electrode of the second switch transistor may be a source electrode. In this way, in a case that there is a signal on the CC pin of the Type-A interface 1, the grid electrode of the first switch transistor Q1 receives a high-level signal to connect the drain electrode and the source electrode. In this case, the grid electrode of the second switch transistor Q2 is connected to the GND pin, so that the second switch transistor Q2 disconnects the drain electrode and the source electrode.

In addition, the first electrode of the third switch transistor Q3 and the first electrode of the fourth switch transistor Q4 are grid electrodes, and in a case that the first switch transistor Q1 is turned on, the grid electrode of the third switch transistor Q3 and the grid electrode of the fourth switch transistor Q4 are pulled down to the GND pin by using the first switch transistor Q1, so that the PMOS transistors Q3 and Q4 are turned on. In addition, in this case, because the first switch transistor Q1 is turned on, the grid electrode of Q2 is also pulled down to the GND pin by using the first switch transistor Q1, so that the NMOS transistor Q2 is turned off.

Correspondingly, in a case that there is no signal on the CC pin of the Type-A interface 1, the first electrode of the first switch transistor Q1 receives a low-level signal, so that the first switch transistor Q1 is turned off, the first electrode of the second switch transistor Q2 is pulled up to the VBUS pin by using the first resistor 44, so that the NMOS transistor Q2 is turned on, and when the first switch transistor Q1 is turned off, the first electrode of the third switch transistor Q3 and the first electrode of the fourth switch transistor Q4 are pulled up to the VBUS pin by using the first resistor 44, so that the PMOS transistors Q3 and Q4 are turned off.

Certainly, during specific implementation, the first switch transistor Q1, the second switch transistor Q2, the third switch transistor Q3, and the fourth switch transistor Q4 may alternatively be other types of transistors, and connection circuits of the switch transistors in the switch circuit 42 are changed accordingly, to connect or disconnect the CC pin of the Type-A interface 1 and the CC pin of the first interface 2 according to a CC signal adjusted by the filter circuit 43. This is not specifically limited herein.

In addition, during specific implementation, as shown in FIG. 3, the second electrode of the first switch transistor Q1 is connected to the third electrode of the third switch transistor Q3 and the third electrode of the fourth switch transistor Q4 through the fourth resistor 45.

In this implementation, the switch circuit 42 is an analog signal control circuit. In this way, a case that a control unit is arranged in the identification module 4 and a switch status of the switch circuit 42 is controlled according to a digital control signal sent by the control unit can be avoided, thereby reducing the production costs of the switch circuit 42.

In an optional implementation, as shown in FIG. 2, the switch circuit includes a change-over switch 42, the first terminal of the switch circuit is a non-movable terminal of the change-over switch 42, and both the second terminal and the third terminal of the switch circuit are movable terminals of the change-over switch 42.

During specific implementation, the change-over switch 42 may be switched according to a control signal transmitted by the filter circuit 43, and the control signal can be any one of an analog control signal or a digital control signal. Specifically, when there is a signal on the CC pin of the Type-A interface 1, the filter circuit 43 sends a first control signal to the change-over switch, and the change-over switch 42 connects the movable terminal and the third terminal in response to the first control signal, that is, the CC pin of the first interface 2 is connected to the CC pin of the Type-A interface 1. When there is no signal on the CC pin of the Type-A interface 1, the filter circuit 43 sends a second control signal to the change-over switch, and the change-over switch 42 connects the movable terminal and the second terminal in response to the second control signal, that is, the CC pin of the first interface 2 is connected to the VBUS pin by using the pull-up resistor 41.

During specific implementation, a control unit may further be arranged in the switch circuit, and the control unit is respectively connected to the filter circuit 43 and the change-over switch 42, to convert the analog signal outputted by the filter circuit 43 into a digital control signal, so as to control a switch status of the change-over switch 42 by using the digital control signal.

In this implementation, the structure of the switch circuit can be simplified by arranging the change-over switch 42 in the switch circuit.

In an optional implementation, the filter circuit 43 is an RC filter circuit.

During application, when there is a signal on the CC pin of the Type-A interface 1, the signal may be a fluctuating level signal, and the fluctuating level signal may be adjusted to a relatively stable level signal by using the RC filter circuit.

In this way, the control signal outputted by the RC filter circuit can be more stable and reliable.

Further as shown in FIG. 3, the filter circuit 43 includes a third resistor 431 and a first capacitor 432.

A first terminal of the third resistor 431 is connected to the CC pin of the Type-A interface 1, a second terminal of the third resistor 431 is connected to a first terminal of the first capacitor 432, a second terminal of the first capacitor 432 is connected to the GND pin of the first interface 2, and the first terminal of the first capacitor 432 is further connected to the control terminal of the switch circuit 42.

In application, when there is no signal on the CC pin of the Type-A interface 1, the filter circuit 43 outputs a low-level signal (a level signal with a value of 0); and when there is a fluctuating level signal on the CC pin of the Type-A interface 1, when the level signal increases, the first capacitor 432 is charged, and when the level signal decreases, the first capacitor 432 discharges, so that the filter circuit 43 outputs a stable high-level signal (a level signal with a value of greater than 0).

Optionally, a capacitance value of the first capacitor 432 is greater than a preset capacitance value.

During specific implementation, the preset capacitance value may be determined according to a turn-on voltage of the transistor Q1 and a level value and a variation characteristic of the signal on the CC pin of the Type-A interface 1. For example, when the turn-on voltage of the first switch transistor Q1 is relatively low, the preset capacitance value may be relatively small; and when the turn-on voltage of the first switch transistor Q1 is relatively high, the preset capacitance value may be relatively high, which is not specifically limited herein.

In this Implementation, the capacitance value of the first capacitor 432 is greater than the preset capacitance value to ensure that when there is a signal on the CC pin of the Type-A interface 1, the first switch transistor Q1 can be always turned on by using the level signal outputted by the filter circuit 43, which improves the controllable reliability of the filter circuit 43 and improves the applicability of the data cable to different application scenarios.

Figure 4:
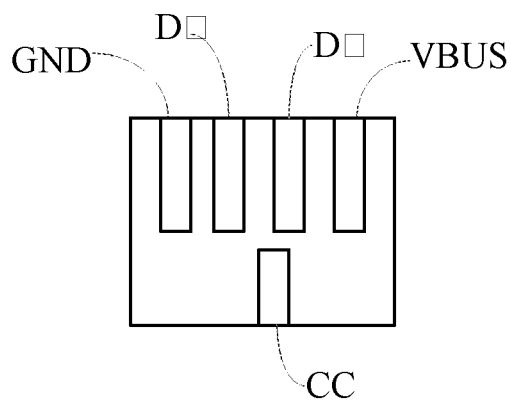
FIG. 4 is a structural diagram of a Type-A interface in a data cable according to an embodiment of this application.

In an optional implementation, as shown in FIG. 4, a first side of the Type-A interface 1 is provided with the GND pin, the D+ pin, the D− pin, and the VBUS pin, a second side of the Type-A interface 1 is provided with the CC pin, and the first side and the second side of the Type-A interface 1 are two opposing sides.

Certainly, distribution positions of the pins of the Type-A interface 1 may be exchanged or changed, which are not specifically limited herein. In addition, structures and working principles of the VBUS pin and the GND pin are the same as structures and working principles of the VBUS pin and the GND pin in the prior art, and details are not described herein again.

In this implementation, the CC pin is arranged on the second side of the Type-A interface 1, so that structures and position distributions of the GND pin, the D+ pin, the D− pin, and the VBUS pin on the first side of the Type-A interface 1 are the same as that in the Type-A interface in the prior art, and the data cable provided in the embodiments of this application is compatible with a conventional Type-A female socket.

Certainly, in a case that the data cable provided in the embodiments of this application is connected to a charger provided with the conventional Type-A female socket, because a CC pin is not arranged in the conventional Type-A female socket, the CC pin of the Type-A interface 1 cannot receive a CC signal. In this case, the charging device supports only fasting charging of the DP/DM communication protocol.

The embodiments of this application further provided a charging device, including a charger and the data cable provided by the foregoing embodiments. The charger includes a Type-A female socket matching the Type-A interface of the data cable, and the Type-A female socket includes: a VBUS pin, a CC pin, a D+ pin, a D− pin, and a GND pin.

The Type-A female socket matching the Type-A interface of the data cable may be understood as that: in a case that a Type-A interface of a data cable 2 is inserted into a Type-A female socket of a charger 1, a pin of the Type-A interface is connected to a same pine of the Type-A female socket.

In addition, the charger further includes a PD charging module and a D+/D− charging module. Specifically, the PD charging module is connected to the CC pin and performs PD protocol communication with a device to be charged by using the CC pin, to support PD fast charging. The D+/D− charging module is connected to the D+ pin and the D− pin and performs DP/DM protocol communication with the device to be charged by using the D+ pin and the D− pin, to support DP/DM fast charging.

It should be noted that, in this implementation, a specific working process of the charging device corresponds to the working process of the data cable 2 in the foregoing embodiments, which is not repeated herein.

In addition, in a case that positions of the pins of the Type-A interface are distributed as shown in FIG. 4, the Type-A female socket matching the Type-A interface may further be connected to a Type-A interface of a conventional data cable, and in a case that the Type-A interface of the charger is connected to the Type-A interface of the conventional data cable, only DP/DM protocol charging is supported.

In the embodiments of this application, the charging device has the Type-A interface and support PD protocol charging and DP/DM protocol charging, and has same beneficial effects as the data cable provided in the embodiments of this applications. Details are not described herein again.

It should be noted that, terms "include", "comprise", or any other variation thereof in this specification is intended to cover a non-exclusive inclusion, which specifies the presence of stated processes, methods, objects, or apparatuses, but do not preclude the presence or addition of one or more other processes, methods, objects, or apparatuses. Without more limitations, elements defined by the sentence "comprising one" does not exclude that there are still other same elements in the processes, methods, objects, or apparatuses. In addition, it should be noted that the scope of the method and device in the implementations of this application is not limited to performing functions in the order shown or discussed, but may also include performing, according to involved functions, the functions basically simultaneously or in a reverse order. For example, the described method may be performed a sequence different from the sequence described, and various steps may be added, omitted, or combined. In addition, features described with reference to some examples may be combined in other examples.

Through the descriptions of the foregoing implementations, a person skilled in the art may clearly understand that the method according to the foregoing embodiments may be implemented through software and a necessary general hardware platform, and certainly, may alternatively be implemented by hardware, but in many cases, the former manner is a better implementation. Based on such understanding, the technical solutions of the embodiments of this application essentially or some contributing to the related art may be implemented in a form of a software product. The computer software product is stored in a storage medium (such as a ROM/RAM, a magnetic disk, or an optical disc) and includes several instructions for instructing a terminal device (which may be a mobile phone, a computer, a server, a network device, or the like) to perform the methods described in the embodiments of this application.

The embodiments of this application have been described above with reference to the accompanying drawings. This application is not limited to the specific embodiments described above, and the specific embodiments described above are merely exemplary and not limitative. Those of ordinary skill in the art may make various variations under the teaching of this application without departing from the spirit of this application and the protection scope of the claims, and such variations shall all fall within the protection scope of this application.

What is claimed is:

1. A data cable, comprising a Type-A interface and a first interface, wherein the Type-A interface and the first interface are connected by a cable, each of the Type-A interface and the first interface comprises a voltage bus (VBUS) pin, a communication control (CC) pin, a data pin D+, a data pin D−, and a GND pin, and the VBUS pin, the data pin D+, the data pin D−, and the GND pin in each of the Type-A interface and the first interface are connected in a one-to-one correspondence; and the data cable is provided with a circuit identification module, the circuit identification module comprises a pull-up resistor, a switch circuit, and a filter circuit, wherein a first terminal of the switch circuit is connected to the CC pin of the first interface, a second terminal of the switch circuit is connected to a first terminal of the pull-up resistor, a third terminal of the switch circuit is connected to the CC pin of the Type-A interface, a second terminal of the pull-up resistor is connected to the VBUS pin of the first interface, a first terminal of the filter circuit is connected to the CC pin of the Type-A interface, a second terminal of the filter circuit is connected to the GND pin of the first interface, and an output terminal of the filter circuit is connected to a control terminal of the switch circuit, wherein under the control of the filter circuit, the first terminal of the switch circuit is connected to the second terminal or the third terminal of the switch circuit;

wherein the switch circuit comprises a first switch transistor, a second switch transistor, a third switch transistor, a fourth switch transistor, a first resistor, and a second resistor;

a first electrode of the first switch transistor is the control terminal of the switch circuit, a second electrode of the first switch transistor is connected to a first electrode of the second switch transistor, a first electrode of the third switch transistor, and a first electrode of the fourth switch transistor, and a third electrode of the first switch transistor is connected to the GND pin of the first interface;

the first electrode of the second switch transistor is further connected to the VBUS pin of the first interface through the first resistor, and a second electrode of the second switch transistor is the second terminal of the switch circuit, and a third electrode of the second switch transistor is the first terminal of the switch circuit;

a second electrode of the third switch transistor is the third terminal of the switch circuit, and a third electrode of the third switch transistor is connected to the second electrode of the first switch transistor through the second resistor; and a second electrode of the fourth switch transistor is connected to the third electrode of the second switch transistor, and a third electrode of the fourth switch transistor is connected to the third electrode of the third switch transistor, wherein in a case that there is no signal on the CC pin of the Type-A interface, the first switch transistor, the third switch transistor, and the fourth switch transistor are all in an off state, and the second switch transistor is in an on state; and in a case that there is a signal on the CC pin of the Type-A interface, the first switch transistor, the third switch transistor, and the fourth switch transistor are all in the on state, and the second switch transistor is in the off state.

2. The data cable according to claim 1, wherein the first interface is a Type-C interface.

3. The data cable according to claim 1, wherein the circuit identification module is arranged in the cable, and a distance between the circuit identification module and one end of the first interface is less than a distance between the circuit identification module and one end of the Type-A interface.

4. The data cable according to claim 1, wherein the first switch transistor and the second switch transistor are N-type transistors, and the third switch transistor and the fourth switch transistor are P-type transistors.

5. The data cable according to claim 4, wherein the first switch transistor and the second switch transistor are NMOS transistors, and the third switch transistor and the fourth switch transistor are PMOS transistors.

6. The data cable according to claim 1, wherein the switch circuit comprises a change-over switch, the first terminal of the switch circuit is a non-movable terminal of the change-over switch, and both the second terminal and the third terminal of the switch circuit are movable terminals of the change-over switch.

7. The data cable according to claim 1, wherein the filter circuit is a resistor-capacitor (RC) filter circuit.

8. The data cable according to claim 7, wherein the filter circuit comprises a third resistor and a first capacitor; and
a first terminal of the third resistor is connected to the CC pin of the Type-A interface, a second terminal of the third resistor is connected to a first terminal of the first capacitor, a second terminal of the first capacitor is connected to the GND pin of the first interface, and the first terminal of the first capacitor is further connected to the control terminal of the switch circuit.

9. A charging device, comprising a data cable and a charger, wherein the data cable comprises a Type-A interface and a first interface, wherein the Type-A interface and the first interface are connected by a cable, each of the Type-A interface and the first interface comprises a voltage bus (VBUS) pin, a communication control (CC) pin, a data pin D+, a pin D−, and a GND pin, and the VBUS pin, the data pin D+, the data pin D−, and the GND pin in each of the Type-A interface and the first interface are connected in a one-to-one correspondence; and the data cable is provided with a circuit identification module, the circuit identification module comprises a pull-up resistor, a switch circuit, and a filter circuit, wherein a first terminal of the switch circuit is connected to the CC pin of the first interface, a second terminal of the switch circuit is connected to a first terminal of the pull-up resistor, a third terminal of the switch circuit is connected to the CC pin of the Type-A interface, a second terminal of the pull-up resistor is connected to the VBUS pin of the first interface, a first terminal of the filter circuit is connected to the CC pin of the Type-A interface, a second terminal of the filter circuit is connected to the GND pin of the first interface, and an output terminal of the filter circuit is connected to a control terminal of the switch circuit, wherein under the control of the filter circuit, the first terminal of the switch circuit is connected to the second terminal or the third terminal of the switch circuit;

the charger comprises a Type-A female socket matching the Type-A interface of the data cable, and the Type-A female socket comprises: a VBUS pin, a CC pin, a data pin D+, a data pin D−, and a GND pin;

wherein the switch circuit comprises a first switch transistor, a second switch transistor, a third switch transistor, a fourth switch transistor, a first resistor, and a second resistor;

a first electrode of the first switch transistor is the control terminal of the switch circuit, a second electrode of the first switch transistor is connected to a first electrode of the second switch transistor, a first electrode of the third switch transistor, and a first electrode of the fourth switch transistor, and a third electrode of the first switch transistor is connected to the GND pin of the first interface;

the first electrode of the second switch transistor is further connected to the VBUS pin of the first interface through the first resistor, and a second electrode of the second switch transistor is the second terminal of the switch circuit, and a third electrode of the second switch transistor is the first terminal of the switch circuit;

a second electrode of the third switch transistor is the third terminal of the switch circuit, and a third electrode of the third switch transistor is connected to the second electrode of the first switch transistor through the second resistor; and a second electrode of the fourth switch transistor is connected to the third electrode of the second switch transistor, and a third electrode of the fourth switch transistor is connected to the third electrode of the third switch transistor, wherein in a case that there is no signal on the CC pin of the Type-A interface, the first switch transistor, the third switch transistor, and the fourth switch transistor are all in an off state, and the second switch transistor is in an on state; and in a case that there is a signal on the CC pin of the Type-A interface, the first switch transistor, the third switch transistor, and the fourth switch transistor are all in the on state, and the second switch transistor is in the off state.

10. The charging device according to claim 9, wherein the first interface is a Type-C interface.

11. The charging device according to claim 9, wherein the circuit identification module is arranged in the cable, and a distance between the circuit identification module and one end of the first interface is less than a distance between the circuit identification module and one end of the Type-A interface.

12. The charging device according to claim 9, wherein the first switch transistor and the second switch transistor are N-type transistors, and the third switch transistor and the fourth switch transistor are P-type transistors.

13. The charging device according to claim 12, wherein the first switch transistor and the second switch transistor are NMOS transistors, and the third switch transistor and the fourth switch transistor are PMOS transistors.

14. The charging device according to claim 9, wherein the switch circuit comprises a change-over switch, the first terminal of the switch circuit is a non-movable terminal of the change-over switch, and both the second terminal and the third terminal of the switch circuit are movable terminals of the change-over switch.

15. The charging device according to claim 9, wherein the filter circuit is a resistor-capacitor (RC) filter circuit.

16. The charging device according to claim 15, wherein the filter circuit comprises a third resistor and a first capacitor; and a first terminal of the third resistor is connected to the CC pin of the Type-A interface, a second terminal of the third resistor is connected to a first terminal of the first capacitor, a second terminal of the first capacitor is connected to the GND pin of the first interface, and the first terminal of the first capacitor is further connected to the control terminal of the switch circuit.

* * * * *